(12) United States Patent
De La Cruz, II et al.

(10) Patent No.: US 7,859,919 B2
(45) Date of Patent: Dec. 28, 2010

(54) MEMORY DEVICE AND METHOD THEREOF

(75) Inventors: Louis A. De La Cruz, II, Pflugerville, TX (US); Scott I. Remington, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 62 days.

(21) Appl. No.: 12/199,093

(22) Filed: Aug. 27, 2008

(65) Prior Publication Data

US 2010/0054051 A1 Mar. 4, 2010

(51) Int. Cl.
*G11C 7/00* (2006.01)

(52) U.S. Cl. .................. 365/189.11; 365/230.05; 365/189.05

(58) Field of Classification Search ............ 365/189.11, 365/230.05, 189.05
See application file for complete search history.

(56) References Cited

U.S. PATENT DOCUMENTS

| | | | |
|---|---|---|---|
| 4,616,342 A | 10/1986 | Miyamoto | |
| 5,546,026 A | 8/1996 | Lin et al. | |
| 5,696,721 A | 12/1997 | McAdams et al. | |
| 5,786,723 A | 7/1998 | Kim | |
| 5,825,205 A | 10/1998 | Ohtsuka | |
| 5,973,955 A | 10/1999 | Nogle et al. | |
| 6,040,991 A | 3/2000 | Ellis-Monaghan et al. | |
| 6,122,191 A | 9/2000 | Hirose et al. | |
| 6,262,598 B1 | 7/2001 | Cairns et al. | |
| 6,363,011 B1 | 3/2002 | Hirose et al. | |
| 6,621,758 B2 | 9/2003 | Cheung et al. | |
| 6,639,827 B2 | 10/2003 | Clark et al. | |
| 6,654,277 B1 | 11/2003 | Hsu et al. | |
| 6,728,145 B2 | 4/2004 | Knupfer et al. | |
| 6,774,696 B2 | 8/2004 | Clark et al. | |
| 6,834,024 B2 | 12/2004 | Frydel et al. | |
| 6,842,059 B1 | 1/2005 | Wu | |
| 7,088,630 B2 | 8/2006 | Hung et al. | |
| 7,161,827 B2 | 1/2007 | Ramaraju et al. | |
| 7,167,392 B1 | 1/2007 | Poplevine et al. | |
| 7,239,558 B1 | 7/2007 | Poplevine et al. | |
| 7,274,603 B2 * | 9/2007 | Futatsuyama et al. .. | 365/189.11 |
| 7,292,495 B1 | 11/2007 | Kenkare et al. | |
| 2002/0080651 A1 | 6/2002 | Tanzawa et al. | |

(Continued)

FOREIGN PATENT DOCUMENTS

GB 2347567 A 6/2000

(Continued)

OTHER PUBLICATIONS

U.S. Appl. No. 11/746,126, filed May 9, 2007.

(Continued)

*Primary Examiner*—Son Dinh
*Assistant Examiner*—Nam Nguyen (57) ABSTRACT

The present application discloses a memory array where each memory bit cell of the array includes a level shifter. In addition, each memory bit cell includes a write port that includes pass gate that can include a p-type field effect transistor and an n-type field effect transistor. The control electrodes of the p-type field effect transistor and the n-type field effect transistor are connected together as part of a common node. In addition, a current electrode of the p-type field effect transistor and a current electrode of the n-type field effect transistor are connected together to form a common node.

20 Claims, 4 Drawing Sheets

U.S. PATENT DOCUMENTS

| | | |
|---|---|---|
| 2003/0052371 A1 | 3/2003 | Matsuzaki et al. |
| 2005/0057976 A1 | 3/2005 | Joo et al. |
| 2005/0078508 A1 | 4/2005 | Chan et al. |
| 2006/0152255 A1 | 7/2006 | Wang et al. |
| 2006/0262620 A1 | 11/2006 | Goldman et al. |
| 2007/0002636 A1 | 1/2007 | Campbell et al. |
| 2007/0241804 A1 | 10/2007 | Campardo et al. |

FOREIGN PATENT DOCUMENTS

| | | |
|---|---|---|
| JP | 08-051351 | 2/1996 |
| JP | 09-106677 | 4/1997 |

OTHER PUBLICATIONS

U.S. Appl. No. 11/534,715, filed Sep. 25, 2006.

International Application No. PCT/US2009/048656, International Search Report and Written Opinion and Dec. 28, 2009.

International Search Report mailed Jul. 25, 2008 for PCT Application PCT/US08/61707, 2 pages.

Office Action mailed Jan. 29, 2008 for U.S. Appl. No. 11/534,715, filed on Sep. 25, 2006, 9 pages.

Office Action mailed May 28, 2008 for U.S. Appl. No. 11/534,715, filed on Sep. 25, 2006, 9 pages.

Final Office Action mailed Oct. 22, 2008 for U.S. Appl. No. 11/534,715, filed on Sep. 25, 2006, 8 pages.

Notice of Allowance mailed Mar. 3, 2009 for U.S. Appl. No. 11/534,715, filed on Sep. 25, 2006, 6 pages.

Notice of Allowance mailed Jul. 25, 2008 for U.S. Appl. No. 11/746,126, filed on May 9, 2007, 7 pages.

Search Report mailed Jun. 28, 2010 for EPC Application No. EP8754938.

\* cited by examiner

MEMORY DEVICE AND METHOD THEREOF

CROSS-REFERENCE TO RELATED APPLICATIONS

The present disclosure is related to U.S. patent application Ser. No. 11/743,126, filed on May 9, 2007, and U.S. patent application Ser. No. 11/534,715, filed on Sep. 25, 2006, which are co-pending applications with the same assignee.

BACKGROUND

1. Field of the Disclosure

The present disclosure relates generally to devices having electronic devices and more particularly to devices having electronic devices with memory.

2. Description of the Related Art

There is a tendency to use lower voltages in electronic devices to conserve power. As devices increase in speed, memory devices can suffer from decreased stability when operating voltages are too low. Therefore, the use of a memory bit cell that latches data at a higher voltage can be beneficial and a device and method of interfacing such a memory cell to other portions of the electronic device would be useful.

BRIEF DESCRIPTION OF THE DRAWINGS

The present disclosure may be better understood, and its numerous features and advantages made apparent to those skilled in the art by referencing the accompanying drawings.

DESCRIPTION OF THE DRAWINGS

The present application discloses a memory array where each memory bit cell of the array includes a level shifter. In addition, each memory bit cell includes a write port having a pass gate that can include a p-type field effect transistor and an n-type field effect transistor. The control electrodes of the p-type field effect transistor and the n-type field effect transistor are connected together as part of a common node. In addition, a current electrode of the p-type field effect transistor and a current electrode of the n-type field effect transistor are connected together to form a common node. Various embodiments of the present disclosure will be better understood with reference to FIGS. 1-5 and the following discussions.

Figure 1:
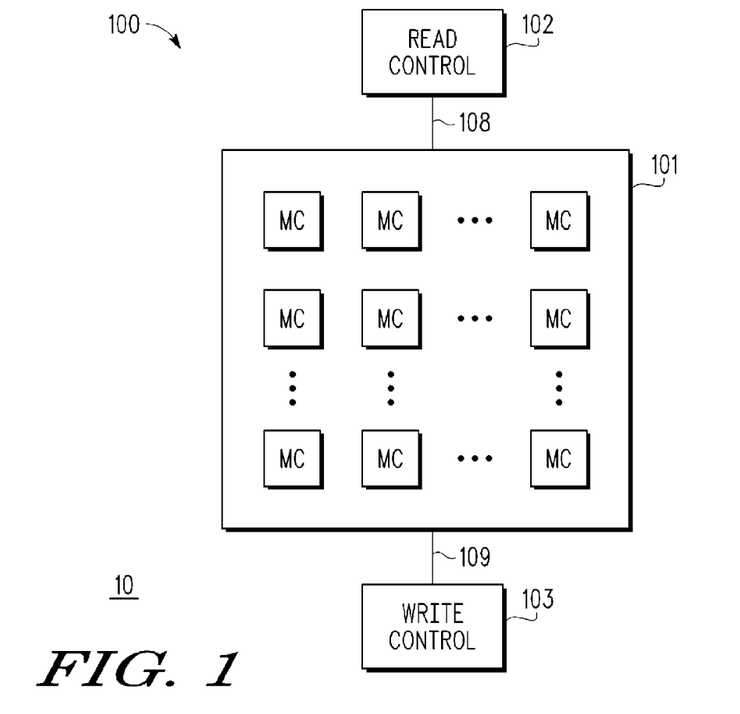
FIG. 1 includes a block diagram of a memory device in accordance with a specific embodiment of the present disclosure.

FIG. 1 illustrates a portion of a device 10 that includes an electronic device that includes a memory 100. Memory 100 includes a memory array 101, a read control portion 102, and a write control portion 103.

The electronic device that includes memory 100 can operate at various voltage levels. For example, portions of the electronic device, including read control portion 102 and write control portion 103, can be designed to operate at voltage referred to as $Vdd_L$, while other portions of the electronic device, such as portions of memory array 101 are designed to operate at a higher voltage than $Vdd_L$, that is referred to as $Vdd_H$. Read control portion 102 is connected to memory array 101 by interconnect 108, and is operable to read information stored at memory array 101. Write control portion 103 is connected to memory array 101 by interconnect 109, and is operable to store information at memory array 101. It will be appreciated that the various interconnects described herein can include one or more individual interconnects.

Memory array 101 includes a plurality of memory cells, such as register cells, having one or more read ports and one or more write ports. The memory cells of memory array 101 operate to implement a read mode; a write mode; and low-power modes, such as a sleep mode. Each memory cell of the plurality of memory bit cells is commonly labeled "MC" in FIG. 1 and includes a corresponding storage cell, level shifter, read port, and write ports as indicated at FIG. 2.

Figure 2:
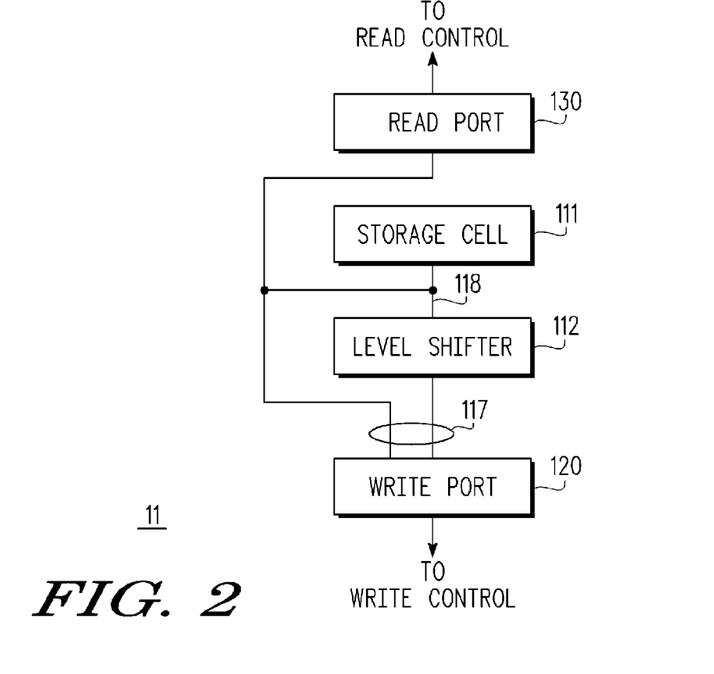
FIG. 2 includes a block diagram of a portion of the memory device of FIG. 1 in accordance with a specific embodiment of the present disclosure.

Referring to FIG. 2, a portion of a memory cell, referred to as a memory bit cell 11, is illustrated that is representative of a portion of one of the memory cells MC of FIG. 1 that is associated with one bit of stored information. The memory bit cell 11 includes a storage cell 111, a level shifter 112, a write port 120, and read ports 130. The storage cell 111 of a memory bit cell 11 can store information by maintaining a signal at a high-voltage level, such as voltage $Vdd_H$, maintaining a signal at a low-voltage level, such as ground, or combination thereof, at interconnect 118 to represent one of two complementary binary states. For example, interconnect 118 can represent a pair of individual interconnects, e.g., storage nodes, where a specific logic state is stored at storage cell 111 by maintaining a high-voltage level at one individual interconnect, and by maintaining a low-voltage level at the other individual interconnect, whereby the voltage level at either interconnect can represent the stored logic value.

The level shifter 112 of memory bit cell 11 can receive a signal from the storage cell having the high-voltage level $Vdd_H$ and provide a signal having the a high-voltage level $Vdd_L$, which has a different magnitude, e.g., a lower voltage level, than the high-voltage level, though both high-voltage levels represent the same logic state. It will be appreciated that the high-voltage level of signals provided to interconnect 117 by the level shifter is selected to be within an operating tolerance of the write port to prevent damage and failure of the write ports. In one embodiment, $VDD_H$ can represent a high-voltage level of approximately 1.10 volts, while $Vdd_L$ can represent a high-voltage level of approximately 0.90 volts.

Figure 3:
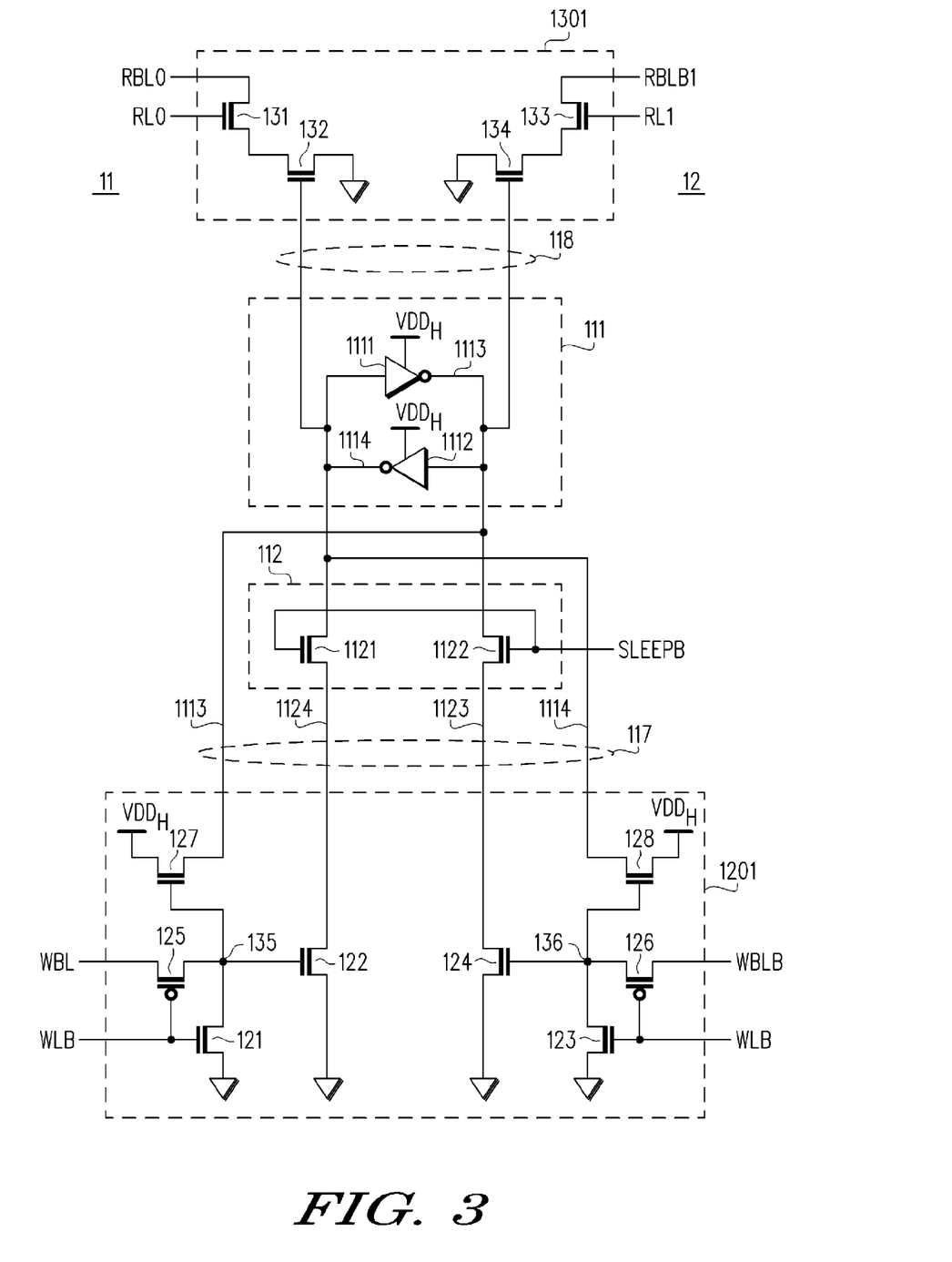
FIG. 3 includes combined circuit and block diagram of portions of FIG. 1 and FIG. 2 in accordance with a specific embodiment of the present disclosure.

FIG. 3 illustrates a specific embodiment of memory bit cell 11 of FIG. 2. The storage cell 111 is illustrated to include a pair of inverters 1111 and 1112. Inverter 1111 includes an input and an output. Inverter 1112 includes an input connected to the output of inverter 1111, and an output connected to the input of inverter 1111. Inverters 1111 and 1112 have an operating tolerance that allows them to operate at voltage $Vdd_H$ without expectation of failure. For example, inverters 1111 and 1112 can be designed with transistors that have relatively thick gate oxides as discussed further herein. Note that the output of inverter 1111 and the input of inverter 1112 are part of a storage node that corresponds to an individual interconnect 1113 of interconnect 118, and that the input electrode of inverter 1111 and the output electrode of inverter 1112 are part of a storage node that corresponds to an individual interconnect 1114 of interconnect 118. Note that the states of signals at nodes 1113 and 1114 remain constant during operation, except when being written to during a write operation, and, therefore, can be referred to as storage nodes.

The level shifter 112 is illustrated to include a transistor 1121 and a transistor 1122. Transistors 1121 and 1122 have an operating tolerance that allows them to operate at voltage $Vdd_H$ without expectation of failure. Transistor 1121 includes a first current electrode connected to the input of inverter 1111, and, therefore, is part of node 1114. Transistor 1121 further includes a second current electrode that is part of node 1124, and a control electrode that is connected to node labeled SLEEPB, and, therefore, is part of node SLEEPB. Transistor 1122 includes a first current electrode connected to the input of inverter 1112, and, therefore, is part of node 1113. Transistor 1122 further includes a second current electrode that is part of node 1123, and a control electrode connected to node SLEEPB. Transistors 1121 and 1122 can be n-type field effect transistors (NFETs). Transistors 1121 and 1122 can have gate-lengths of the same length, shorter length, or longer length than other transistors illustrated at FIG. 3, such as transistors 122 and 124. In one embodiment, the gate lengths of transistors 1121 and 1122 are the same and are chosen to be longer than the gate lengths of other transistors of the memory 100 to reduce leakage between storage cell 111 and interconnects 1123 and 1124 in response to an asserted sleep signal being received at node SLEEPB.

Portion 1201 of FIG. 3 represents a portion of write port 120 that causes a bit of information to be stored at memory bit cell 11 during a write operation, as described herein, and is also referred to as write port portion 1201. Write port portion 1201 includes transistors 121-128, where transistors 121-124, 127 and 128 can be NFETs, and transistors 125 and 126 can be p-type field effect transistors (PFETs), therefore being of opposite conductivity type from transistors 1121 and 1122. Transistors 127 and 128 have an operating tolerance that allows them to operate at voltage $Vdd_H$ without expectation of failure. Transistors 121-126 can have an operating tolerance that allows them to operate at voltage $Vdd_L$, but that prevents their operating at $Vdd_H$ without expectation of failure. For example, transistors that have an operating tolerance that allows them to operate at $Vdd_H$ can have gate dielectrics that are thicker than gate dielectrics of transistors that have an operating tolerance that prevents their operation at $Vdd_H$ without failure. While transistors with thin gate dielectrics can operate faster, and at a lower voltage, than transistors with thicker gate dielectrics, they can be physically damaged by the larger operating voltage levels, such as $Vdd_H$, of transistors having thicker gate dielectrics capable of being subjected to the larger voltage levels. Physical damage of a transistor can cause it to fail during operation.

Transistor 125 comprises a first current electrode that is part of a bit line node labeled WBL, a second current electrode, and a control electrode that is part of a write line node labeled WLB. Transistor 121 comprises a first current electrode connected to a ground reference node that is to provide a reference signal, such as ground, during operation, a second current electrode connected to the second current electrode of transistor 125, and a control electrode connected to the control electrode of the transistor 125. Transistor 122 comprises a first current electrode connected to the ground reference node, a second current electrode connected to the second current electrode of transistor 1121, and a control electrode connected to the second current electrode of the transistor 125. Transistor 127 comprises a first current electrode connected to a Vdd reference node to provide a high voltage, such as $Vdd_H$, during operation, a second current electrode connected to the input of inverter 1112, and a control electrode coupled to the second current electrode of the transistor 125.

Transistor 126 comprises a first current electrode that is part of a bit line node labeled WBLB, a second current electrode, and a control electrode that is part of a node labeled WLB. Transistor 123 comprises a first current electrode connected to the ground reference node, a second current electrode connected to the second current electrode of transistor 126, and a control electrode connected to the control electrode of the transistor 126. Transistor 124 comprises a first current electrode connected to the ground reference node, a second current electrode connected to the second current electrode of transistor 1122, and a control electrode connected to the second current electrode of the transistor 126. Transistor 128 comprises a first current electrode connected to the Vdd reference node, a second current electrode connected to the input of inverter 1111, and a control electrode coupled to the second current electrode of the transistor 126.

During a write operation, the bit line nodes WBL and WBLB are driven with signals representing complementary binary states, e.g., one bit line node is driven to $Vdd_L$ while the other bit line node is driven to ground. In response to an asserted write enable signal at node WLB, transistors 125 and 126 operate as pass transistors to communicate information at their respective bit lines, WBL and WBLB, to nodes 135 and 136, respectively. By selecting transistors 125 and 126 to be PFETs, as illustrated at FIG. 3, the write enable signal at node WLB can be an active low signal, whereby a low-level voltage signal, such as ground, at node WLB is referred to as an asserted write enable signal because the low-level voltage signal can turn on transistors 125 and 126, while a high-level voltage signal, such as $Vdd_L$, at node WLB is referred to as a negated write enable signal because it can turn off transistors 125 and 126. Nodes 135 and 136 are pre-charged to ground, with respect to a write operation. For example, transistors 121 and 123 are turned on by a negated write enable signal at node WLB prior to a write operation, thereby causing nodes 135 and 136 to be pulled to ground at the start of the write operation.

Portion 1301 of FIG. 3 represents a portion of read ports 202 that illustrates two separate read ports that can read a bit of information stored at memory bit cell 11 independent from each other during respective read operations. Portion 1301 is also referred to as read port portion 1301. Read port portion 1301 includes transistors 131-134, which can be NFETs. Transistors 131 and 133 have an operating tolerance that allows them to operate at voltage $Vdd_L$ without expectation of failure, but that prevents their operating at $Vdd_H$ without expectation of failure. Transistors 132 and 134 have an operating tolerance that allows them to operate at voltage $Vdd_H$ without expectation of failure One read port of read port portion 1301 includes transistors 131 and 132. Transistor 131 includes a first current electrode that is part of a read bit line node labeled RBL0, a second current electrode, and a control electrode that is part of a node labeled RL0. Transistor 132 has a first current electrode connected to the second current electrode of transistor 131, a second current electrode connected to a ground voltage reference node, and a control electrode that is connected to the node 1114. Transistor 133 comprises a first current electrode that is part of a bit line node labeled RBLB1, a second current electrode, and a control electrode that is part of a node RL1. Transistor 134 has a first current electrode connected to the second current electrode of transistor 133, a second current electrode connected to a ground voltage reference node, and a control electrode that is connected to the node 1113.

During a read operation of the read port connected to node 1114, the read bit line RBL0 can be precharged, and an asserted read signal is received at the node RL0. The signal at node 1114 is used to determine whether transistor 132 is turned on or off during a read operation. For example, the signal at node 1114 can be sensed by a sense amplifier, not illustrated, of the read control portion 102 connected to the read bit line RBL0. During a read operation at the read port connected to node 1113, the read bit line RBLB1 can be precharged, and an asserted read signal is received at the node RL1. The signal at node 1113 is used to determine whether transistor 134 is turned on or off during a read operation. For example, the signal at node 1114 can be sensed by a sense amplifier, not illustrated, of the read control portion 102 that can be connected to the read bit line RBLB1.

For purposes of discussion below, with respect to a write operation, the following is assumed: a negated write enable signal is being received at node WLB; the storage state of storage cell 111 is such that node 1114 is at $Vdd_H$ and node 1113 is at ground; a negated sleep signal, e.g., $Vdd_H$, is being received at node SLEEPB; the bit lines WBL and WBLB are receiving signals having voltage levels at $VDD_L$ and ground, respectively, that represent a information to be written to memory bit cell 11.

Transistors 125 and 126 are turned off in response to the negated write enable signal at WLB, such as during a read operation, to prevent the logic state represented at bit lines WBL and WBLB from being communicated to nodes 135 and 136, and allowing nodes 135 and 136 to be pre-charged to ground via transistors 121 and 123, respectively. Transistors 1121 and 1122 are turned on, thereby allowing node 1123 to be pulled to ground in response to inverter 1111, and node 1124 to be driven to a high-voltage that is shifted down from the high-voltage level of inverter 1112, $Vdd_H$, at node 1114. For example, the voltage at node 1124 can be equal to the voltage at node 1114 shifted down by the source-to-drain voltage drop of transistor 1121 ($Vdd_H - V_{sd}$). The level shifting implemented by level shifter 112 prevents transistor 122 from being exposed to the voltage $Vdd_H$, which would be expected to cause a failure of transistor 122.

In response to the write enable signal at node WLB being asserted, transistors 125 and 126 are turned on to communicate signals at bit lines WBL and WBLB to nodes 135 and 136, respectively, and transistors 121 and 123 are turned off. Therefore, the bit line signals at WBL and WBLB are communicated to nodes 135 and 136, which are driven to $Vdd_L$ and ground, respectively. Note, that node 136 was precharged to ground and remains at ground in response to the ground signal at WBLB. The voltage $Vdd_L$ at node 135 causes transistors 122 and 127 to be turned on, while the voltage ground at node 136 causes transistors 124 and 128 to be turned off. In response to transistor 122 turning on, the voltage at node 1124 transitions toward ground, causing the voltage at node 1114 of the storage cell 111 to also transition toward ground. In response to transistor 127 turning on, the voltage at node 1113 of the storage cell transitions toward $Vdd_H$. As nodes 1114 and 1113 transition towards ground and $Vdd_H$, respectively, inverters 1111 and 1112 will change state when their respective input switching thresholds are met.

During a low power mode, a low-power indicator, such as a sleep signal, is received at the node labeled SLEEPB to turn off transistors 1121 and 1122, thereby electrically isolating the storage cell 111, from the write port 1201. This can reduce leakage from the memory bit cell 111 when the memory bit cell maintains data during a low power mode of operation. Also, the signal at the node SLEEPB can be asserted to cause the level shifter to electrically isolate the write port 120 from the storage cell during a read operation. However, doing so can slow down the write path of a device, since transistors 1121 and 1122, which need to have relatively thick gate dielectrics in order to withstand the operating voltage of the storage cell, turn on relatively slow.

Figure 5:
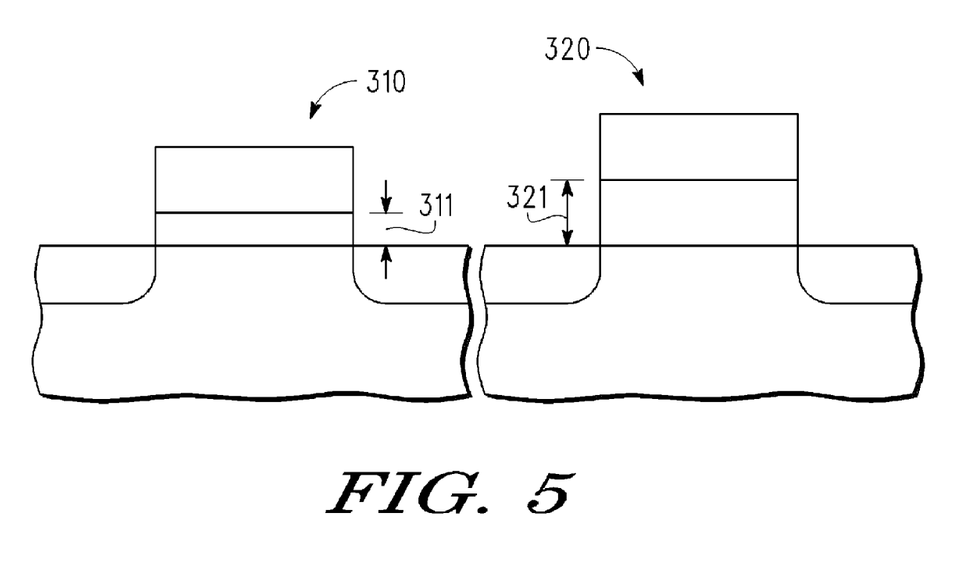
FIG. 5 illustrates transistors in accordance with a present embodiment having gate dielectrics with different thicknesses.

FIG. 5 illustrates a transistor at location 310 and a transistor at location 320. The transistor at location 310 is illustrated to have a gate dielectric with a dimension 311 that is thinner than the dimension 320 of the gate dielectric of the transistor at location 320. As discussed above, transistors having thinner gate dielectrics are susceptible to damage at lower voltages than transistors having thicker gate dielectrics.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. For example, low power control as described herein need not be implemented, whereby the control electrodes of transistors 1121 and 1122 could always be driven by signal at $Vdd_H$. In addition, transistors 127 and 128 can be removed to allow just transistors 122 and 124 to communicate information to storage cell 111. Similarly, transistors 122 and 124 can be removed to allow just transistors 127 and 128 to communicate information to storage cell 111. Transistors can be used with different gate oxide thickness, where transistors with relatively thicker gate oxides can be expected to operate at $Vdd_H$ as compared to transistors with relatively thinner gate oxides that are not expected to operate at $Vdd_H$. It will be appreciated that not all of the transistors that have been identified as being low power transistors, e.g., transistors not expected to operate at $Vdd_H$, need be implemented as low power transistors. For example, transistors 121 and 123 can be implemented with high-power transistors having relatively thicker gates, without affecting a speed path of the write portion 1201.

Figure 4:
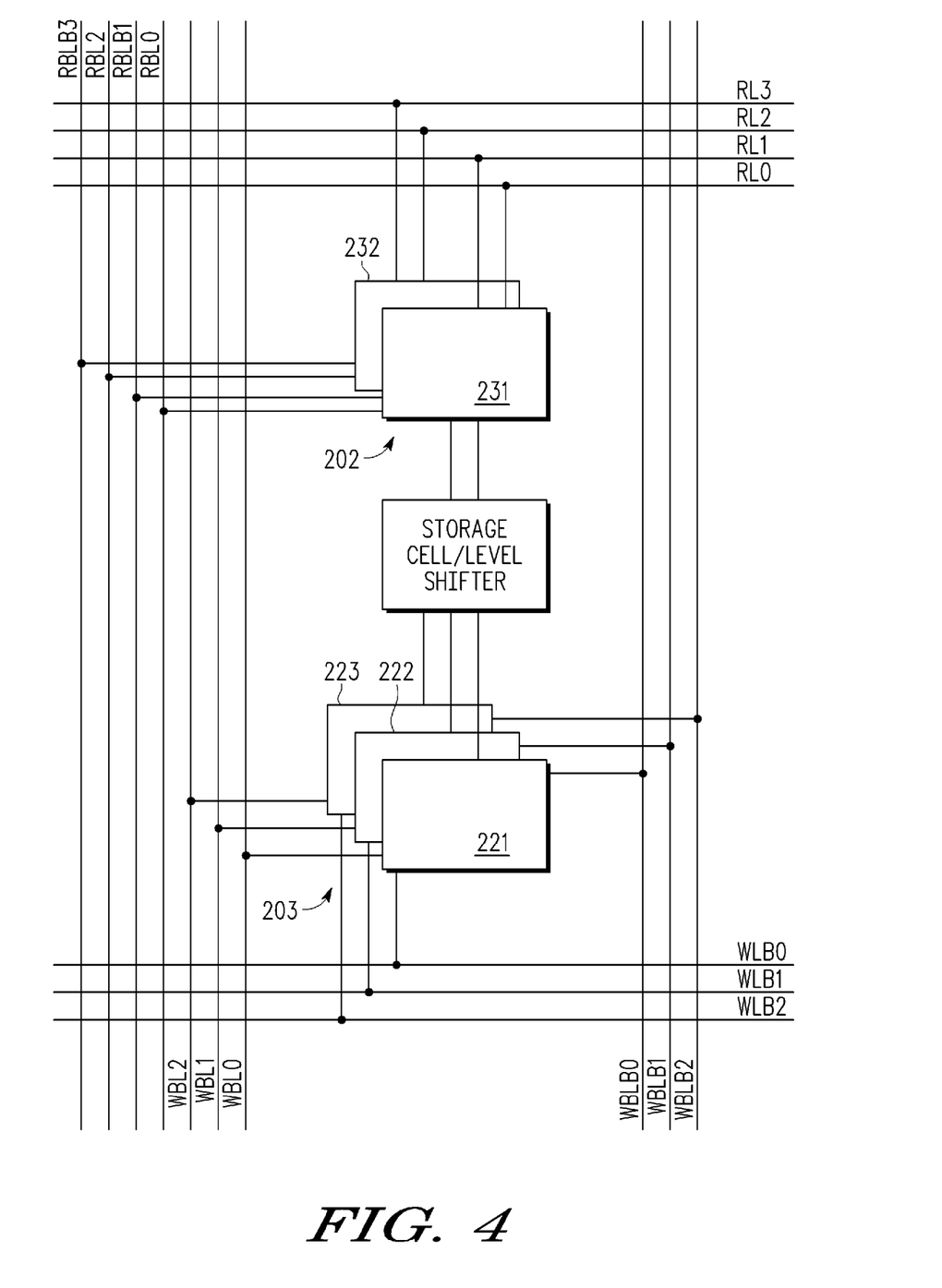
FIG. 4 includes a block diagram of a memory device in accordance with a specific embodiment of the present disclosure.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. For example, the signal polarities, and conductivity types of the transistors illustrated in the write port can be reversed, and different numbers of read and write ports can be implemented. For example, FIG. 4 illustrates a specific embodiment of a memory bit cell having multiple dual-read ports 202, multiple write ports 203, and a storage cell/level shifter. Each dual-read port of the plurality of read ports 202 is connected to corresponding read bit line nodes and read line nodes. For example: read port 231 is connected to bit line nodes RBL0 and RBLB1, and read lines RL0 and RL1; read port 232 is connected to bit line nodes RBL2 and RBLB3, and read lines RL2 and RL3. Similarly, each write port of the plurality of write ports 203 is connected to a corresponding write bit line node and write line node. For example: write port 221 is connected to write bit line node WBL0, write bit line node WBLB0, and write line node WLB0; write port 222 is connected to write bit line node WBL1, write bit line node WBLB1, and write line node WLB1; write port 223 is connected to write bit line node WBL2, write bit line node WBLB2, and write line node WLB2. As a further example: the Vdd reference node connected to transistors 127 and 128 can be a switched $Vdd_H$ reference node, whereby the voltage level $Vdd_H$ is to be provided to the respective current electrodes of transistors 127 and 128 during a write operation, and is otherwise not provided during other operations; inverters 1111 and 1112 can be designed to include transistors that have thicker gate dielectrics than transistors 121-126, 131 and 133; and each memory bit cell can include multiple read and write ports as described herein, where each write port can have unique bit lines and write line, and each read port can have a unique bit line and read line.

Furthermore, it will be appreciated that a node that connects different elements as described herein is also considered a node of each individual element. For example, node 1124 is common to transistors 1121 and 122 of FIG. 3, and therefore connects an electrode of transistor 1121 to an electrode of transistor 122. However, the term node as used with respect to a specific element can include a shared node. For example, "a node of the level shifter 112" can include a portion of node 1124. Therefore, the occurrences of the term "node" in the statement "a node of level shifter 112 is connected to a node of write port portion 1201" both refer to portions of node 1124 as illustrated at FIG. 3. Also, as used herein the terms "node" and "interconnect" are intended to be synonymous. The terms "pulled" and "driven" as used with respect to a node are intended to be synonymous. For example, a node described as being "pulled to ground" can also be described as being "driven to ground," and a node described as being "driven to Vdd" can also be described as being "pulled to Vdd."

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising:
    a memory array comprising a plurality of memory bit cells, each memory bit cell of the plurality of memory bit cells comprising:
        a storage cell to store a bit of information; and
        a level shifter comprising a first node coupled to the storage cell to receive a first voltage during a read operation representing the bit of stored information stored at the storage cell, and a second node to provide a second voltage representing the bit of stored information, where a magnitude of the first voltage is different than a magnitude of the second voltage.

2. The device of claim 1 wherein each memory bit cell further comprises:
    a write port comprising a bit line node to receive a bit of information to be stored at the memory bit cell during a write operation, a write line node to receive a write enable signal that is asserted during the write operation, and a first node coupled to the second node of the level shifter to receive a third voltage representing the bit of information to be stored.

3. The device of claim 2, wherein the write port further comprises a second node coupled to a first storage node of the storage cell to communicate a fourth voltage representing the bit of information to be stored to the first storage node during the write operation.

4. The device of claim 2, wherein the write port further comprises a first transistor comprising a first current electrode, a second current electrode, and a control electrode, where the first transistor is a transistor of a first conductivity type, and the bit line node comprises the first current electrode and the write line node comprises the control electrode.

5. The device of claim 4, wherein the write port further comprises a second transistor comprising a first current electrode, a second current electrode coupled to the second current electrode of the first transistor, and a control electrode coupled to the write line node, where the second transistor is a transistor of a second conductivity type, opposite than the first conductivity type.

6. The device of claim 5, wherein the transistor of the first conductivity type is a PFET transistor, and the transistor of the second conductivity type is an NFET transistor.

7. The device of claim 4, wherein the write port further comprises a second transistor comprising a first current electrode, a second current electrode coupled to the second current electrode of the first transistor, and a control electrode coupled to the write line node.

8. The device of claim 7, wherein the level shifter further comprises a third transistor comprising a first current electrode, a second current electrode, and a control electrode, where the first node of the level shifter comprises the first current electrode, and the second node of the level shifter comprises the second current electrode.

9. The device of claim 8, wherein the write port further comprises a fourth transistor comprising a first current electrode, a second current electrode, and a control electrode coupled to the second current electrode of the first transistor of the write port.

10. The device of claim 8, wherein the first node of the level shifter is coupled to a first storage node of the storage cell, and the write port further comprises:
    a second node coupled to a second storage node of the storage cell to communicate a fourth voltage to the second storage node during the write operation that is based upon the information received at the bit line node; and
    a fourth transistor comprising a first current electrode, a second current electrode, and a control electrode coupled to the second current electrode of the first transistor, where the second node of the write port comprises the first current electrode.

11. The device of claim 10 wherein the third voltage represents a first logic value and the fourth voltage represents a second logic value complementary to the first logic value.

12. The device of claim 1, wherein the level shifter further comprises a second node to receive a low power indicator, wherein the second voltage is to represent the bit of stored information in response to the low power indicator being negated, and the second signal does not represent the bit of stored information in response to the low power indicator being asserted.

13. The device of claim 1, wherein the level shifter further comprises a first transistor comprising a first current electrode, a second current electrode, and a control electrode, wherein the first node comprises the first current electrode, and the second node comprises the second current electrode.

14. A device comprising:
    a memory array comprising a plurality of memory bit cells, each memory bit cell of the plurality of bit cells comprising:
    a first write port comprising
        a first transistor comprising a first current electrode coupled to receive information from a first bit line node to be stored at a memory bit cell of the plurality of memory bit cells, a second current electrode to receive the second information from the first current electrode in response to a first write indicator being enabled, and a control electrode to receive the first write indicator, where the first transistor is a PFET transistor; and a second transistor comprising a first current electrode coupled to a voltage reference node to receive a reference voltage during a first write operation, a second current electrode coupled to the second current electrode of the first transistor, and a control electrode coupled to the control electrode of the first transistor, where the second transistor is an NFET transistor.

15. The device of claim 14 further comprising:
a second write port comprising
   a first transistor comprising a first current electrode coupled to receive second information from a second bit line to be stored at the bit cell, a second current electrode to receive the second information from the first current electrode in response to a second write indicator being enabled, and a control electrode to receive the second write indicator, where the first transistor is a PFET transistor; and
   a second transistor comprising a first current electrode coupled to the voltage reference node to receive the reference voltage during a second write operation, a second current electrode coupled to the second current electrode of the first transistor, and a control electrode coupled to the control electrode of the first transistor.

16. The device of claim 14 wherein the first write port further comprises:
   a third transistor comprising a first current electrode coupled to the memory bit cell, a second current electrode, and a control electrode coupled to the second current electrode of the first transistor.

17. The device of claim 16 wherein the first write port further comprises:
   a fourth transistor comprising a first current electrode coupled to the memory bit cell, a second current electrode, and a control electrode coupled to the second current electrode of the first transistor.

18. The device of claim 16 further comprising a level shifter having a first node to receive a first high-level voltage from the bit cell representative of a logic state, and a second node to provide second high-level voltage from the level shifter representative of the logic state, where the first high-level voltage has a magnitude greater than the second high-level voltage.

19. A method comprising:
   receiving an asserted write enable signal during a write operation;
   turning on a first transistor in response to receiving the asserted write enable signal to communicate information at a first electrode of the first transistor to a node that comprises the second electrode of the first transistor, the information to be stored at a storage cell; and
   turning off a second transistor in response to receiving the asserted write enable signal;
   receiving a negated write enable signal during a read operation;
   turning on the second transistor in response to receiving the negated write enable signal to communicate a reference signal to a first electrode of the second transistor to the node.

20. The method of claim 19 further comprising:
   during the write mode, shifting, at a memory bit cell, a first high-voltage level at a storage node of the memory bit cell to a second high-voltage level.

* * * * *